(12) United States Patent
Yao et al.

(10) Patent No.: US 10,790,476 B2
(45) Date of Patent: Sep. 29, 2020

(54) OLED DISPLAY SUBSTRATE AND METHOD FOR PREPARING THE SAME, AND DISPLAY DEVICE

(71) Applicants: HEFEI XINSHENG OPTOELECTRONICS TECHNOLOGY CO., LTD., Hefei, Anhui (CN); BOE TECHNOLOGY GROUP CO., LTD., Beijing (CN)

(72) Inventors: Gu Yao, Beijing (CN); Ruhui Zhu, Beijing (CN); Tingyuan Duan, Beijing (CN)

(73) Assignees: HEFEI XINSHENG OPTOELECTRONICS TECHNOLOGY CO., LTD., Hefei, Anhui (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/511,272

(22) Filed: Jul. 15, 2019

(65) Prior Publication Data

US 2020/0194732 A1   Jun. 18, 2020

(30) Foreign Application Priority Data

Dec. 13, 2018 (CN) .......................... 2018 1 1525498

(51) Int. Cl.
*H01L 51/56* (2006.01)
*H01L 51/52* (2006.01)
(Continued)

(52) U.S. Cl.
CPC .......... *H01L 51/56* (2013.01); *H01L 27/3246* (2013.01); *H01L 27/3283* (2013.01);
(Continued)

(58) Field of Classification Search
CPC . H01L 51/56; H01L 27/3246; H01L 27/3283; H01L 51/5228; H01L 51/0035;
(Continued)

(56) References Cited

U.S. PATENT DOCUMENTS

| | | | |
|---|---|---|---|
| 2012/0217516 A1* | 8/2012 | Hatano | ................. H01L 51/525 257/88 |
| 2013/0092919 A1* | 4/2013 | Kurihara | ................. H01L 51/56 257/40 |

(Continued)

*Primary Examiner* — Dzung Tran
(74) *Attorney, Agent, or Firm* — Brooks Kushman P.C.

(57) ABSTRACT

A method for preparing an OLED display substrate of an embodiment of the present disclosure comprises: providing a substrate comprising pixel definition regions each for defining a pixel unit, and forming a first electrode in the pixel unit; forming a pixel definition structure and an auxiliary electrode in the pixel definition region, the pixel definition structure being configured to separate the first electrode from the auxiliary electrode; forming a phase transition structure; forming a light-emitting layer to cover the phase transition structure and the first electrode; exciting the phase transition structure to contract the phase transition structure, thereby causing the light-emitting layer to be broken at a position corresponding to the contraction of the phase transition structure to form an opening; and forming a second electrode, such that the second electrode covers the light-emitting layer and is electrically connected to the auxiliary electrode through the opening.

18 Claims, 4 Drawing Sheets

(51) Int. Cl.
*H01L 27/32* (2006.01)
*H01L 51/00* (2006.01)

(52) U.S. Cl.
CPC ........ *H01L 51/5228* (2013.01); *H01L 51/004* (2013.01); *H01L 51/0035* (2013.01); *H01L 51/0043* (2013.01); *H01L 51/0094* (2013.01)

(58) Field of Classification Search
CPC   H01L 51/004; H01L 51/0043; H01L 51/0094
USPC .......................................................... 257/40
See application file for complete search history.

(56) References Cited

U.S. PATENT DOCUMENTS

| | | | |
|---|---|---|---|
| 2014/0312323 A1* | 10/2014 | Park | H01L 51/525 257/40 |
| 2015/0144902 A1* | 5/2015 | Do | H01L 27/3246 257/40 |
| 2016/0013436 A1* | 1/2016 | Im | H01L 51/5206 257/40 |
| 2016/0013438 A1* | 1/2016 | Im | H01L 51/5228 257/40 |
| 2016/0181566 A1* | 6/2016 | Wang | H01L 51/525 257/40 |

* cited by examiner

OLED DISPLAY SUBSTRATE AND METHOD FOR PREPARING THE SAME, AND DISPLAY DEVICE

CROSS-REFERENCE TO RELATED APPLICATION

This application claims priority to Chinese Patent Application No. 201811525498.8 filed on Dec. 13, 2018, which is incorporated herein by reference in its entirety.

TECHNICAL FIELD

The present disclosure relates to the field of display technology, in particular, to a display substrate, a method for preparing the same and a display device.

BACKGROUND

Organic light-emitting diode (OLED) has the advantages of self-illumination, wide viewing angle and light weight, compared with liquid crystal display (LCD), and is considered as the next generation display technology.

Existing OLED devices typically include an anode and a cathode, and a light-emitting layer between the anode and the cathode. According to different light directions, it can be divided into a bottom-emitting device and a top-emitting device. Since the top-emitting device can obtain a larger aperture ratio and can significantly increase the screen brightness, it has become a hot research in recent years.

However, the related art OLED device has a remarkable phenomenon of uneven light emission.

SUMMARY

A method for preparing an OLED display substrate comprises: providing a substrate comprising pixel definition regions each for defining a pixel unit, and forming a first electrode in the pixel unit; forming a pixel definition structure and an auxiliary electrode in the pixel definition region, the pixel definition structure being configured to separate the first electrode from the auxiliary electrode; forming a phase transition structure; forming a light-emitting layer to cover the phase transition structure and the first electrode; exciting the phase transition structure to contract the phase transition structure, thereby causing the light-emitting layer to be broken at a position corresponding to the contraction of the phase transition structure to form an opening; and forming a second electrode, such that the second electrode covers the light-emitting layer and is electrically connected to the auxiliary electrode through the opening.

Optionally, the forming the phase transition structure comprises forming a first phase transition structure on a surface of the auxiliary electrode away from the substrate.

Optionally, the pixel definition structure encloses a first closed pattern, with a first holding region being in a pattern body of the first closed pattern, and with the auxiliary electrode being formed in the first holding region.

Optionally, a middle portion of the first holding region between at least partially adjacent two pixel units further has a second holding region, and the forming the phase transition structure comprises forming a second phase transition in the second holding region on the substrate.

Optionally, the exciting the phase transition structure comprises irradiating the phase transition structure with a laser beam.

Optionally, the laser beam has a wavelength of 330 to 380 nm, an energy density of 10 to 6000 $mJ/cm^2$, a frequency of 100 to 3000 Hz, and a duration of 5 to 1000 ns.

Optionally, a material for forming the phase transition structure comprises one or a mixture of polyimide or polysiloxane containing azobenzene structure, polyimide containing a benzopyrylospiran structure, chlorinated polyethylene, and acryloyl-cinnamoyl-ethylene diester copolymer (HEA-CA).

Optionally, the first electrode is an anode and the second electrode is a cathode.

An embodiment of the present disclosure further provides an OLED display substrate comprising: a substrate comprising pixel definition regions each for defining a pixel unit; a first electrode arranged in the pixel unit; a pixel definition structure and an auxiliary electrode arranged in each of the pixel definition regions, the pixel definition structure being configured to separate the first electrode from the auxiliary electrode; a phase transition structure arranged at a position proximate to the auxiliary electrode above the substrate, which has been contracted due to being excited; a light-emitting layer covering the phase transition structure and the first electrode, which is broken at a position corresponding to the contraction of the phase transition structure to form an opening, thereby exposing at least a part of a surface of the auxiliary electrode; and a second electrode covering the light-emitting layer and being electrically connected to the auxiliary electrode through the opening.

Optionally, the phase transition structure comprises a first phase transition structure arranged on a surface of the auxiliary electrode away from the substrate.

Optionally, the opening comprises a first opening corresponding to a position of the first phase transition structure, and a surface of the auxiliary electrode away from the substrate is electrically connected to the second electrode through the first opening.

Optionally, the pixel definition structure encloses a first closed pattern, with a first holding region being in a pattern body of the first closed pattern, and with the auxiliary electrode being formed in the first holding region; and a middle portion of the first holding region between at least partially adjacent two pixel units further has a second holding region, and the second holding region is provided with a second phase transition structure.

Optionally, the opening comprises a second opening corresponding to a position of the second phase transition structure, with a side surface of the auxiliary electrode being electrically connected to the second electrode through the second opening.

Optionally, a size of the second phase transition structure is smaller than a size of the auxiliary electrode in a direction perpendicular to the substrate.

An embodiment of the present disclosure further provides a display device comprising the OLED display substrate as described above.

Reference numbers: 1, substrate; 2, anode; 30, pixel defining region; 3, pixel definition structure; 4, auxiliary cathode; 5, phase transition structure; 51, first phase transition structure; 52, second phase transition structure; 6, light-emitting layer; 61, first opening; 62, second opening; 7, cathode; 31, pixel unit; 80, first closed pattern; 91, first holding region; and 92, second holding region.

DETAILED DESCRIPTION

In order to allow one skilled in the art to better understand the technical solutions of the present disclosure, the present disclosure will be further described below in detail in conjunction with the drawings and detailed description.

The inventors have found that at least the following problems exist in the related art. Generally, the pixel definition structure defines a pixel unit, and the first electrode on the substrate is separated by a pixel definition structure, while the light-emitting layer and the cathode are both whole layer structure. The top-emitting OLED device needs very thin cathodes and reflective anodes to increase the transmission of light, while the problem with thin transparent cathodes is that the resistance is higher and the IR drop is more severe. In general, the farther away from the power supply point, the more obvious the voltage drop of the OLED light-emitting surface, thereby resulting in significant uneven light emission of the OLED device.

Embodiment 1

Figure 1:
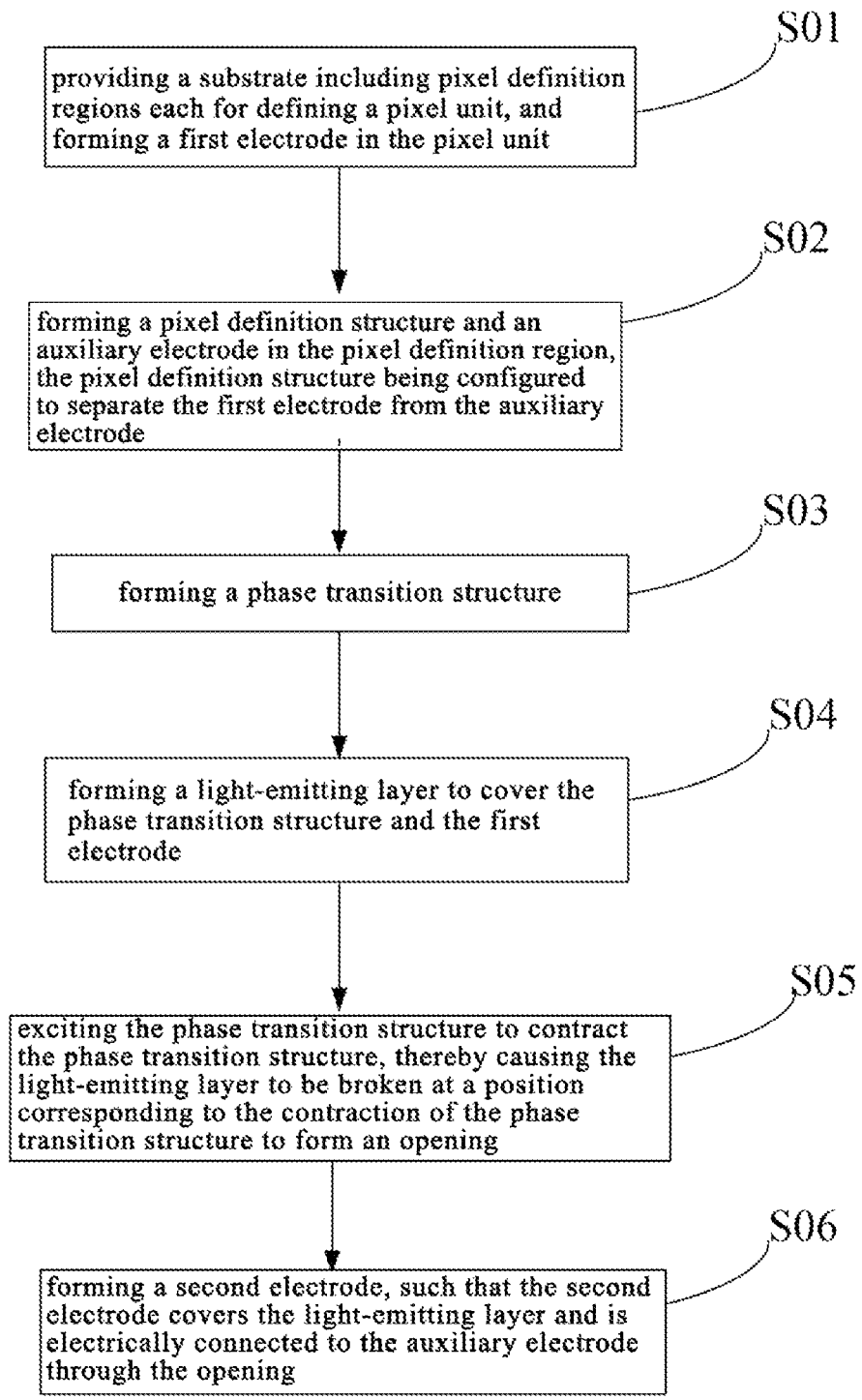
FIG. 1 is a flow chart of a method for preparing an OLED display substrate according to one embodiment of the present disclosure.
Figure 2:
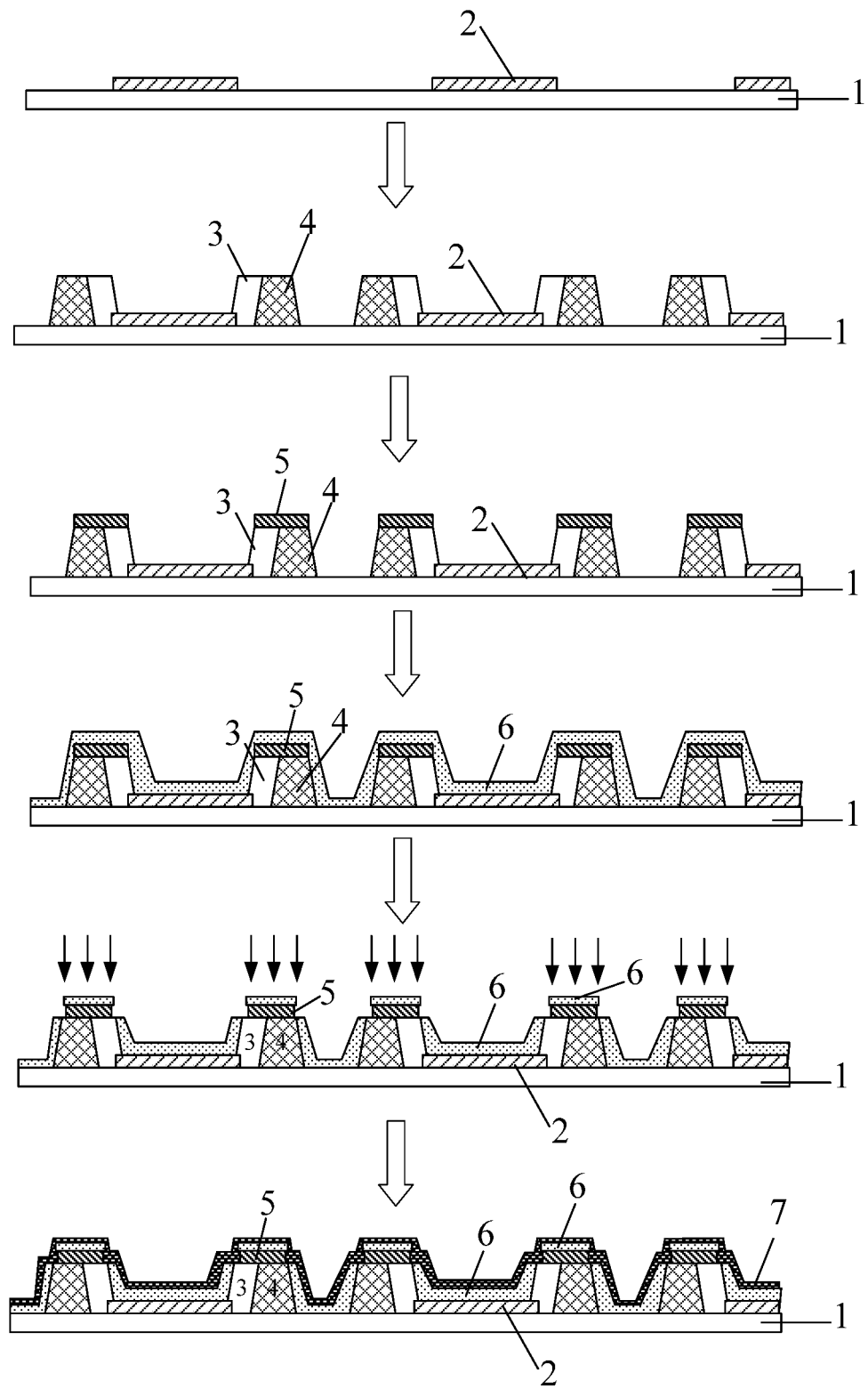
FIG. 2 is a schematic view showing a method for preparing an OLED display substrate according to one embodiment of the present disclosure.

This embodiment provides a method for preparing an OLED display substrate, as shown in FIG. 1, comprising:

S01, providing a substrate comprising pixel definition regions each for defining a pixel unit, and forming a first electrode in the pixel unit;

S02, forming a pixel definition structure and an auxiliary electrode in the pixel definition region, the pixel definition structure being configured to separate the first electrode from the auxiliary electrode;

S03, forming a phase transition structure;

S04, forming a light-emitting layer to cover the phase transition structure and the first electrode;

S05, exciting the phase transition structure to contract the phase transition structure, thereby causing the light-emitting layer to be broken at a position corresponding to the contraction of the phase transition structure to form an opening; and S06, forming a second electrode, such that the second electrode covers the light-emitting layer and is electrically connected to the auxiliary electrode through the opening.

In this embodiment, a phase transition structure is formed on a surface of the auxiliary electrode away from the substrate, and is contracted by the excitation, thereby causing the light-emitting layer to form an opening. Thus, the second electrode is electrically connected to the auxiliary electrode through the opening when the light-emitting layer is covered by the second electrode. Without patterning the light-emitting layer, the method also ensures that the auxiliary electrode is connected to the second electrode through the opening, to reduce the resistance of the second electrode.

Embodiment 2

This example provides a method for preparing an OLED display substrate, as shown in FIGS. 2, 4-6, comprising:

S1, providing a substrate 1, comprising pixel definition regions each for defining a pixel unit, and forming an anode 2 in the pixel unit, in which a pixel definition region is between adjacent pixel units.

Optionally, the anode 2 may be formed by a process such as magnetron sputtering or vacuum evaporation, and patterned by a process such as exposure etching. The material of the anode 2 may be one or a mixture of alloy materials selected from Al, Ag, and Mg.

S2, forming a pixel definition structure 3 and an auxiliary cathode 4 (i.e., auxiliary electrode), both contacting the substrate 1, in the pixel definition region.

Optionally, a material of the pixel definition structure 3 may be selected from resin, polyimide, silicone or silica. The size of the pixel definition structure 3 in the direction perpendicular to the substrate 1 (which may also be referred to as the thickness of the pixel definition structure 3) may be 100 nm to 700 nm.

Optionally, a material of the auxiliary cathode 4 may be at least one selected from molybdenum, aluminum, copper, silver, and niobium. The size of the auxiliary cathode 4 in the direction perpendicular to the substrate 1 (which may also be referred to as the thickness of the auxiliary cathode 4) may be same as the size of the pixel definition structure 3, or may be different from the size of the pixel definition structure 3. The size of the auxiliary cathode 4 is not limited, and for example, the thickness of the auxiliary cathode 4 may also be in the range of 100 nm to 700 nm.

S3, forming a phase transition structure 5.

In one embodiment, the forming the phase transition structure 5 comprises forming a first phase transition structure 51 on a surface of the auxiliary cathode 4 away from the substrate 1.

Figure 4:
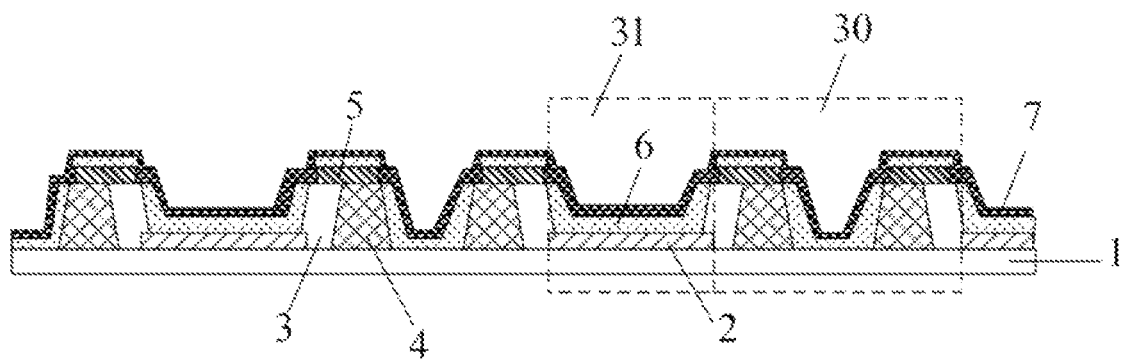
FIG. 4 is a cross-sectional view showing a structure of an OLED display substrate according to some embodiments of the present disclosure.
Figure 5:
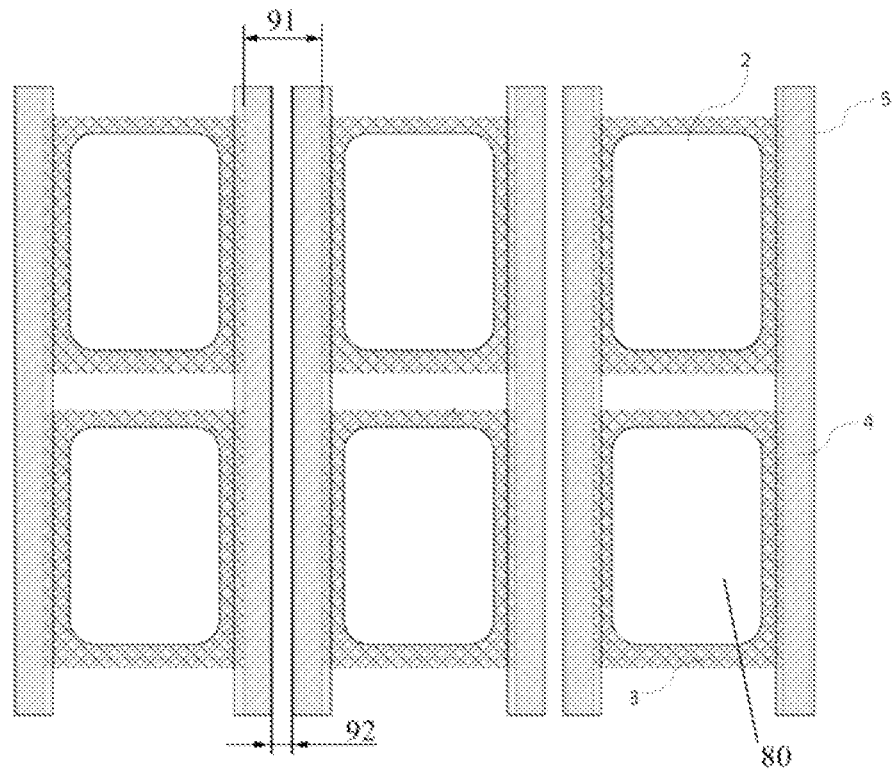
FIG. 5 is a top view of an OLED display substrate according to some embodiments of the present disclosure.

Among them, the first phase transition structure 51 is as shown in FIGS. 4 and 5, and the pixel definition structure 3 encloses a first closed pattern 80, with a first holding region 91 being in a pattern body of the first closed pattern 80, and with the auxiliary cathode 4 being formed in the first holding region 91. That is to say, the first closed pattern 80 of the pixel definition structure 3 defines a pixel unit in which the anode 2 is arranged; and the auxiliary holding cathode 4 is arranged in the first holding region 91 on the first closed pattern 80. The first phase transition structure 51 is formed on the surface of the auxiliary cathode 4 away from the substrate 1.

Figure 6:
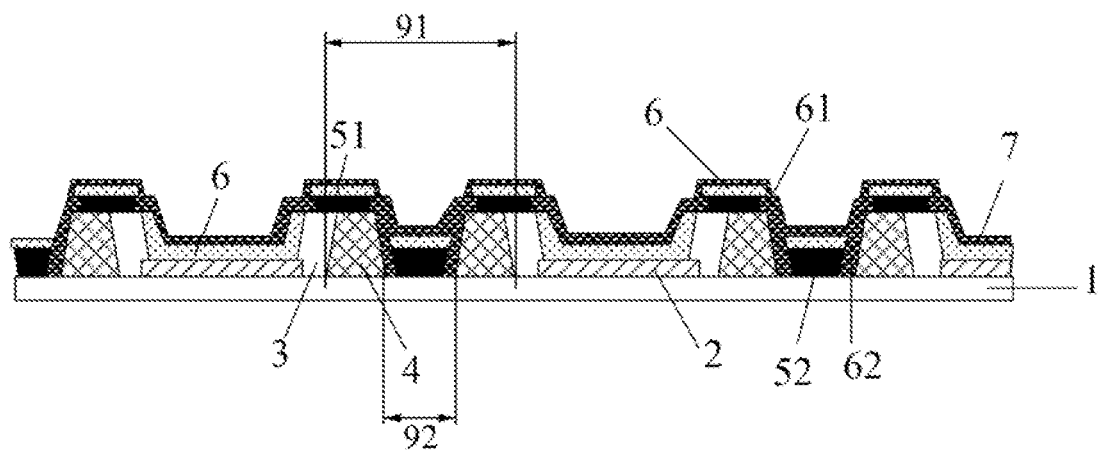
FIG. 6 is a cross-sectional view showing a structure of an OLED display substrate according to another embodiment of the present disclosure.

In another embodiment, as shown in FIG. 6, the forming the phase transition structure 5 further comprises forming a second phase transition structure 52.

Specifically, a middle portion of the first holding region 91 between at least partially adjacent two pixel units further has a second holding region 92, and the forming the phase transition structure comprises forming a second phase transition 52 in the second holding region 92 on the substrate. It should be noted that the first phase transition structure 51 and the second phase transition structure 52 may be formed in different stages, or may be formed simultaneously, in which a process may be saved if the they are formed simultaneously.

The material for forming the phase transition structure 5 may be polyimide or polysiloxane containing azobenzene structure, or may be polyimide containing a benzopyrylo-spiran structure, chlorinated polyethylene, and acryloyl-cinnamoyl-ethylene diester copolymer and the like.

S4, forming a light-emitting layer 6 on the substrate 1 after the above S1 to S3 is completed, such that the light-emitting layer 6 covers the phase transition structure 5 and the first electrode.

Here, the light-emitting layer 6 may be formed by vacuum evaporation or inkjet printing. In the present embodiment, the light-emitting layer 6 is a layer structure covering whole layer. It should be noted that the light-emitting layer 6 may also be a multilayer structure. For example, the light-emitting layer 6 may comprise a hole injection layer (HIL), a hole transport layer (HTL), an emitting material layer (EML), an electron transport layer (ETL) and an electron injection layer (EIL).

S5, exciting the phase transition structure 5 to contract the phase transition structure 5, thereby causing the light-emitting layer 6 to be broken at a position corresponding to the contraction of the phase transition structure 5 to form an opening.

As an optional implementation in this embodiment, the exciting the phase transition structure 5 comprises an irradiation with a laser. The laser light for irradiation may be selected or changed according to the material of the phase transition structure 5.

In one embodiment, the laser beam has a wavelength of 330 to 380 nm, an energy density of 10 to 6000 mJ/cm², a frequency of 100 to 3000 Hz, and a duration of 5 to 1000 ns.

Figure 3:
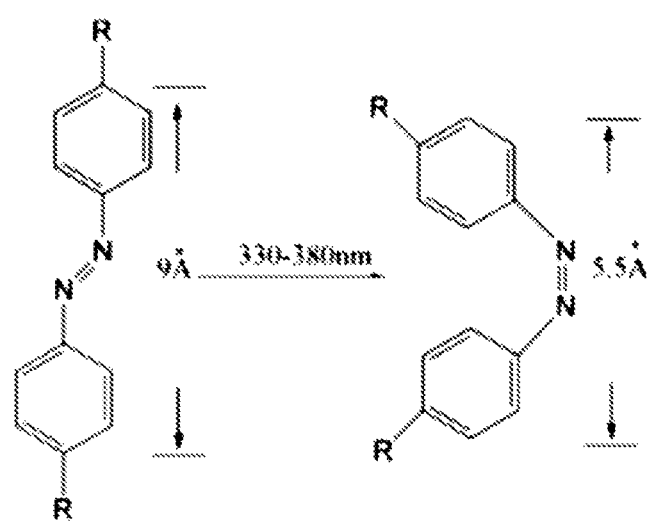
FIG. 3 is a schematic view showing the isomeric variation of azobenzene molecules according to some embodiments of the present disclosure.

Taking a high polymer containing azobenzene structure as an example, after exposure to light of a certain wavelength, the azobenzene molecule undergoes a cis-trans isomerization reaction, as shown in FIG. 3, and the molecular length becomes short and contraction occurs.

Specifically, the light-emitting layer 6 shown in FIGS. 4 and 5 is broken at a position corresponding to the contraction of the phase transition structure 5 to form an opening. The light-emitting layer 6 shown in FIG. 6 is not only broken at a position corresponding to the contraction of the first phase transition structure 51 to form the first opening 61, but also broken at a position corresponding to the contraction of the second phase transition structure 52 to form the second opening 62.

S6, forming a cathode 7 on the substrate 1 after the above S1 to S5 is completed, such that the cathode 7 covers the light-emitting layer 6, and is electrically connected to the auxiliary cathode 4 through the opening.

Specifically, the cathode 7 may be formed of a composite material of one or more of magnesium-silver mixture, indium zinc oxide IZO, indium tin oxide ITO, aluminum-doped zinc oxide AZO, or the like.

In the present embodiment, the phase transition structure 5 is formed on the surface of the auxiliary cathode 4 away from the substrate 1 and is contracted by the excitation, thereby causing the light-emitting layer 6 covering whole layer to be broken at a position corresponding to the contraction of the phase transition structure 5 to form an opening, such that the cathode 7 when it covers the light-emitting layer 6 is electrically connected to the auxiliary cathode 4 through the opening. Without patterning the light-emitting layer 6, this method also ensures that the auxiliary electrode 4 is connected to the cathode 7 through the opening, to reduce the resistance of the cathode 7.

In the present embodiment, a scheme where the first electrode is the anode 2 and the second electrode is the cathode 7 (the second electrode is the cathode 7 and the auxiliary electrode is the auxiliary cathode 4) has been described as an example. The scheme where the first electrode is the cathode 7 and the second electrode is the anode 2 is similar to the scheme of the present embodiment, and a detailed description is omitted here.

Embodiment 3

This embodiment provides an OLED display substrate, as shown in FIG. 4, comprising: a substrate 1, comprising a pixel defining region 30 for defining a plurality of pixel units 31; an anode 2 arranged in the pixel unit; a pixel definition structure 3 and an auxiliary cathode 4 arranged in each of the pixel definition regions 30 and both contacting the substrate 1; a phase transition structure 5 arranged at a position proximate to the auxiliary cathode 4 above the substrate 1, which has been contracted due to being excited; a light-emitting layer 6 covering the phase transition structure and the anode 2, which is broken at a position corresponding to the contraction of the phase transition structure 5 to form an opening, thereby exposing at least a part of a surface of the auxiliary electrode 4; and a cathode 7 covering the light-emitting layer 6 and being electrically connected to the auxiliary cathode 4 through the opening. In the present embodiment, the anode 2 is below the light-emitting layer 6, and the cathode 7 is above the light-emitting layer 6 as an example. The scheme where the cathode 7 and the anode 2 are interchanged is similar to this embodiment, and a detailed description is omitted here.

In this embodiment, the anode 2 is a patterned structural layer. Therefore, on the substrate 1, the region containing the anode 2 is a region of a pixel unit, and the region not containing the anode 2 does not emit light even if it covers the cathode 7, and does not belong to pixel units. Referring to FIG. 4, the region not containing the anode 2 is the pixel definition region 30. Optionally, the anode 2 may be composed of an alloy of one or more of Al, Ag, and Mg.

In one embodiment, as shown in FIG. 5, the pixel definition structure 3 encloses a first closed pattern 80, with a first holding region being in a pattern body of the first closed pattern 80, and with the auxiliary cathode being formed in the first holding region.

The phase transition structure 5 comprise a first phase transition structure 51 arranged on a surface of the auxiliary cathode away from the substrate 1.

For example, in the direction perpendicular to the substrate 1, the size of the auxiliary cathode 4 is same as the size of the pixel definition structure 3. Optionally, the thickness of the pixel definition structure 3 and the auxiliary cathode 4 may both be in the range of 100 nm to 700 nm.

Optionally, the opening comprises a first opening 61 corresponding to the position of the first phase transition structure 51, and the surface of the auxiliary cathode 4 away from the substrate 1 is electrically connected to the cathode 7 through the first opening 61.

In another embodiment, the middle portion of the first holding region 91 between at least partially adjacent two pixel units further has a second holding region 92, and the second holding region 92 is provided with a second phase transition structure 52. As shown in FIG. 6, the second phase transition structure 52 may be arranged in the second holding region 92 in the middle portion of the first holding region 91 between the two pixel units in adjacent columns, or a second phase transition structure 52 may be arranged in the second holding region 92 in the middle portion of the first holding region 91 between two pixel units in adjacent rows.

In the present embodiment, the auxiliary cathode 4 is interposed in the pixel definition structure 3, and the auxiliary cathode 4 may be made of at least one of molybdenum, aluminum, copper, silver, and niobium. The pixel definition structure 3 may be composed of a material, such as resin, polyimide, silicone or silica. Specifically, as shown in FIG. 6, the phase transition material is also retained in the region between the auxiliary cathodes 4. After the irradiation with the laser, the breakage of the light-emitting layer 6 is increased so that the overlapping area of the cathode 7 and the auxiliary cathode 4 is increased and the contact area between the cathode 7 and the auxiliary cathode 4 is increased, which is more advantageous for reducing the electric resistance.

Optionally, the opening comprises a second opening 62 corresponding to a position of the second phase transition structure 52, with a side surface of the auxiliary cathode 4 being electrically connected to the second electrode 7 through the second opening 62.

Specifically, the size of the second phase transition structure 52 is smaller than the size of the auxiliary cathode 4 in a direction perpendicular to the substrate 1. That is, the thickness of the second phase transition structure 52 is different from that of the auxiliary cathode 4, that is, the thickness of the second phase transition structure 52 is smaller than that of the auxiliary cathode 4, which is more advantageous for increasing the total area of the breakage of the light-emitting layer 6.

In the drawings corresponding to this embodiment, the size, thickness, and the like of each structural layer shown are merely illustrative. In the process implementation, the projected area of each structural layer on the substrate may be the same or different. The desired projected area of each structural layer can be achieved by an etching process. At the same time, the geometry of each structural layer is not limited by the structure shown in the drawings, for example, it may be a rectangle as shown in the drawing, or may be trapezoidal, or other shape formed by etching. They can also be achieved by etching.

Embodiment 4

The embodiment provides a display device comprising any one of the above OLED display substrates. The display device may be: an electronic paper, an OLED panel, a mobile phone, a tablet computer, a television, a display, a notebook computer, a digital photo frame, a navigator, or any product or component having a display function.

It is to be understood that the above embodiments are merely exemplary embodiments to explain the principles of the present disclosure, but the present disclosure is not limited thereto. One skilled in the art would make various modifications and improvements without departing from the spirit and scope of the present disclosure. These modifications and improvements should also be regarded as the protection scope of the present disclosure.

What is claimed is:

1. A method for preparing an Organic Light-Emitting Diode (OLED) display substrate, comprising:
   providing a substrate comprising pixel definition regions each for defining a pixel unit, and forming a first electrode in the pixel unit;
   forming a pixel definition structure and an auxiliary electrode in the pixel definition region, the pixel definition structure being configured to separate the first electrode from the auxiliary electrode;
   forming a phase transition structure on both the pixel definition structure and the auxiliary electrode and directly in contact with both the pixel definition structure and the auxiliary electrode;
   forming a light-emitting layer to cover the phase transition structure and the first electrode;
   exciting the phase transition structure to contract the phase transition structure, thereby causing the light-emitting layer to be broken at a position corresponding to the contraction of the phase transition structure to form an opening; and
   forming a second electrode, such that the second electrode covers the light-emitting layer and is electrically connected to the auxiliary electrode through the opening.

2. The method of claim 1, wherein the forming the phase transition structure comprises forming a first phase transition structure on a surface of the auxiliary electrode away from the substrate.

3. The method of claim 1, wherein the pixel definition structure encloses a first closed pattern, with a first holding region being in a pattern body of the first closed pattern, and with the auxiliary electrode being formed in the first holding region.

4. The method of claim 3, wherein a middle portion of the first holding region between at least partially adjacent two pixel units further has a second holding region, and the forming the phase transition structure comprises forming a second phase transition the second holding region on the substrate.

5. The method of claim 1, wherein the exciting the phase transition structure comprises irradiating the phase transition structure with a laser beam.

6. The method of claim 5, wherein the laser beam has a wavelength of 330 to 380 nm, an energy density of 10 to 6000 mJ/cm$^2$, a frequency of 100 to 3000 Hz, and a duration of 5 to 1000 ns.

7. The method of claim 1, wherein a material for forming the phase transition structure comprises one or a mixture of polyimide or polysiloxane containing azobenzene structure, polyimide containing a benzopyrylospiran structure, chlorinated polyethylene, and acryloyl-cinnamoyl-ethylene diester copolymer.

8. The method of claim 1, wherein the first electrode is an anode and the second electrode is a cathode.

9. The method of claim 1, wherein a material of the auxiliary electrode is at least one selected from molybdenum, aluminum, copper, silver, and niobium, and a material of the pixel definition structure is selected from resin, polyimide, silicone or silica.

10. An OLED display substrate, comprising:
    a substrate, comprising pixel definition regions each for defining a pixel unit;
    a first electrode arranged in the pixel unit;
    a pixel definition structure and an auxiliary electrode arranged in each of the pixel definition regions, the pixel definition structure being located between the first electrode and the auxiliary electrode to separate the first electrode from the auxiliary electrode;
    a phase transition structure arranged on both the pixel definition structure and the auxiliary electrode and directly in contact with both the pixel definition structure and the auxiliary electrode;
    a light-emitting layer covering the phase transition structure and the first electrode, which is broken at a position corresponding to the contraction of the phase transition structure to form an opening, thereby exposing at least a part of a surface of the auxiliary electrode; and a second electrode covering the light-emitting layer and being electrically connected to the auxiliary electrode through the opening.

11. The OLED display substrate of claim 10, wherein the phase transition structure comprises a first phase transition structure arranged on a surface of the auxiliary electrode away from the substrate.

12. The OLED display substrate of claim 11, wherein the opening comprises a first opening corresponding to a position of the first phase transition structure, and a surface of the auxiliary electrode away from the substrate is electrically connected to the second electrode through the first opening.

13. The OLED display substrate of claim 10, wherein the pixel definition structure encloses a first closed pattern, with a first holding region being in a pattern body of the first closed pattern, and with the auxiliary electrode being formed in the first holding region; and a middle portion of the first holding region between at least partially adjacent two pixel units further has a second holding region, and the second holding region is provided with a second phase transition structure.

14. The OLED display substrate of claim 13, wherein the opening comprises a second opening corresponding to a position of the second phase transition structure, with a side surface of the auxiliary electrode being electrically connected to the second electrode through the second opening.

15. The OLED display substrate of claim 14, wherein a size of the second phase transition structure is smaller than a size of the auxiliary electrode in a direction perpendicular to the substrate.

16. The OLED display substrate of claim 10, wherein a material for forming the phase transition structure comprises one or a mixture of polyimide or polysiloxane containing azobenzene structure, polyimide containing a benzopyrylospiran structure, chlorinated polyethylene, and acryloyl-cinnamoyl-ethylene diester copolymer.

17. The OLED display substrate of claim 10, wherein a material of the auxiliary electrode is at least one selected from molybdenum, aluminum, copper, silver and niobium, and a material of the pixel definition structure is selected from resin, polyimide, silicone or silica.

18. A display device, comprising a driving module, a system module, and a display module comprising the OLED display substrate of claim 10.

* * * * *